United States Patent
Tanida et al.

(10) Patent No.: US 7,009,652 B1
(45) Date of Patent: Mar. 7, 2006

(54) IMAGE INPUT APPARATUS (75) Inventors: Jun Tanida, Kobe (JP); Kenji Yamada, Kawachinagano (JP); Daisuke Miyazaki, Yamatokoriyama (JP); Yoshiki Ichioka, Kobe (JP); Shigehiro Miyatake, Osaka (JP); Kouichi Ishida, Sakai (JP)

(73) Assignees: Minolta Co. Ltd, Osaka (JP); Japan Science and Technology Corporation, Satima-Ken (JP)

( * ) Notice: Subject to any disclaimer, the term of this patent is extended or adjusted under 35 U.S.C. 154(b) by 886 days.

(21) Appl. No.: 09/639,990

(22) Filed: Aug. 16, 2000

(30) Foreign Application Priority Data

Aug. 20, 1999 (JP) .................................. 11-233760

(51) Int. Cl.
*H04N 5/225* (2006.01)
(52) U.S. Cl. ....................................... 348/340; 348/291
(58) Field of Classification Search ................ 348/291, 348/340, 208.1, 345, 273; 250/208.1, 216, 250/226
See application file for complete search history.

(56) References Cited

U.S. PATENT DOCUMENTS

| 5,321,297 A | * | 6/1994 | Enomoto .................... 257/432 |
| 5,396,090 A | * | 3/1995 | Nakai ........................ 257/233 |
| 5,712,730 A | * | 1/1998 | Zarschitzky et al. ........ 359/569 |
| 6,016,224 A | * | 1/2000 | Namiki ...................... 359/619 |
| 6,137,535 A | * | 10/2000 | Meyers ...................... 348/340 |
| 6,249,335 B1 | * | 6/2001 | Hirukawa et al. ........... 355/53 |
| 2001/0043163 A1 | * | 11/2001 | Waldern et al. ............. 345/7 |

FOREIGN PATENT DOCUMENTS

| JP | 59-50042 | 12/1984 |
| JP | 05-100186 | 4/1993 |
| JP | 10-107975 | 4/1998 |
| WO | WO 99/26419 | 5/1999 |

* cited by examiner

*Primary Examiner*—David L. Ometz
*Assistant Examiner*—Yogesh Aggarwal
(74) *Attorney, Agent, or Firm*—Morrison & Foerster LLP

(57) ABSTRACT

An image input apparatus has a photoelectric converter element having a flat photosensitive surface and an image formation unit array having a plurality of image formation units arranged in an array. This image formation units individually receive light beams substantially from an identical area and focus the received light beams on different regions of the photosensitive surface of the photoelectric converter element to form images thereon.

4 Claims, 10 Drawing Sheets

IMAGE INPUT APPARATUS

This application is based on application No. H11-233760 filed in Japan on Aug. 20, 1999, the entire contents of which are hereby incorporated by reference.

BACKGROUND OF THE INVENTION

1. Field of the Invention

The present invention relates to an image input apparatus that forms an image through a plurality of minute-image-formation optical systems.

2. Description of the Prior Art

In recent years, with the advent of highly information-oriented society brought by the development of communications media, there has been a keen demand for acquiring various kinds of information effectively and timely. Such information includes a very large proportion of image information, and therefore recording and saving of image information are essential for conducting advanced information processing activities. Conventionally, apparatuses such as photographic cameras and video cameras have been used for recording and saving image information. However, it is impossible to miniaturize beyond a certain limit such apparatuses by making their constituent components smaller, and therefore, to realize apparatuses so compact as to be portable all the time, it is necessary, and in fact expected, to develop a compact image input apparatus based on a novel construction.

An arrangement conventionally known to help miniaturize an image input apparatus makes use of a lens array composed of a plurality of microlenses combined together. This is an application of the compound-eye seen in the visual system of insects, and helps realize an optical system that occupies less volume, offers a wider angle of view, and is brighter than a "single-eye" image formation system.

As a conventional image input apparatus adopting this arrangement, for example, Japanese Published Patent Application No. S59-50042 discloses an image input apparatus composed of a microlens array, a pinhole array, and an image surface. Here, the microlenses form a reduced image of an object, and the pinholes, paired one to one with the microlenses, sample different parts of this reduced image, forming together an image of the object on the image surface.

As another example, Japanese Laid-Open Patent Application No. H5-100186 discloses an image input apparatus composed of a microlens array, a pinhole array, and a photosensitive element array. Here, the microlenses, pinholes, and photosensitive elements are grouped into units each composed of a microlens, a pinhole, and a photosensitive element, and the individual units convert optical signals received from different parts of an object (subject) into electric signals, that together represent image information.

As still another example, Japanese Laid-Open Patent Application No. H10-107975 discloses an image input apparatus in which a plurality of photosensitive elements are arranged for each of microlenses. Here, the image of an object formed by the microlenses is not sampled by pinholes that individually sample different parts thereof, but is directly read by a two-dimensionally extending photosensitive element array that yields signals of minute images. Here, an aperture stop is arranged on the object side of the photosensitive element array and the microlens array, and the individual microlenses observe different parts of the object with no overlap among the signals obtained.

However, the image input apparatuses disclosed in Japanese Published Patent Application No. S59-50042 and Japanese Laid-Open Patent Application No. H5-100186 mentioned above both have basically the same optical system, and suffer from unsatisfactory resolution in the image signals obtained. Specifically, in a lens-pinhole type compound-eye optical system, the number of units each including a microlens and a photosensitive element coincides with the number of dots, i.e. resolution, of the obtained image, therefore it is inevitable to increase the number of units to obtain a high-resolution image. However, even a microlens needs to have a certain size to function satisfactorily as a lens, and therefore, in this compound-eye optical system, it is impossible to increase beyond a certain limit the number of units even if the microlens are arranged in a closest packed structure. As a result, it is difficult to obtain a high-resolution image.

On the other hand, the arrangement disclosed in Japanese Laid-Open Patent Application No. H10-107975 mentioned above solves the problem of unsatisfactory resolution in the image signals obtained, but, to obtain the best optical characteristics in this optical system, it is necessary to arrange the microlenses array and the photosensitive element array on a spherical surface having its center at the aperture stop, and thus this arrangement is not fit for the purpose of making the entire image input apparatus satisfactorily compact. In particular, the individual photosensitive elements need to be arranged at discrete locations on a curved surface, i.e. a spherical surface in this case. This makes the photosensitive elements difficult to arrange in desired positions, and thus makes the entire image input apparatus difficult to manufacture.

In another invention, no aperture stop is used, and a microlens array and a photosensitive element array are each arranged on a flat plane. However, here, to prevent interference between the optical signals from adjacent microlenses, the photosensitive element array needs to be arranged at a certain distance from the microlens array, and thus the photosensitive element array requires an unduly large fitting area. In addition, this arrangement is specialized for narrow object angles at the cost of optical characteristics, and therefore exhibits various drawbacks in practical use.

SUMMARY OF THE INVENTION

An object of the present invention is to provide an image input apparatus that has a simple construction, that is more compact than ever, and that offers high-resolution images.

To achieve the above object, according to the present invention, an image input apparatus is provided with: a photoelectric converter element having a flat photosensitive surface; and an image formation unit array having a plurality of image formation units arranged in an array. Here, the plurality of image formation units individually receive light beams substantially from an identical area and focus the received light beams on different regions of the photosensitive surface of the photoelectric converter element to form images thereon.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
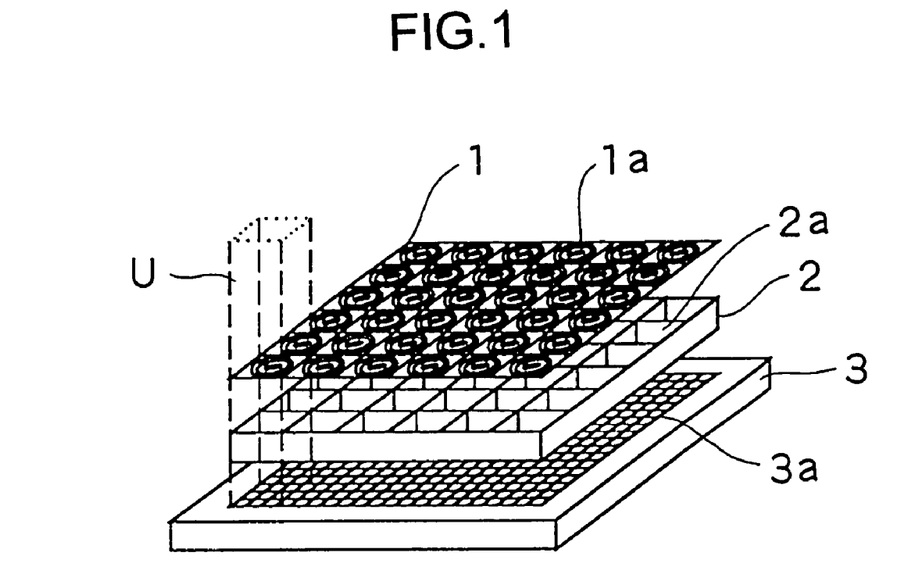
FIG. 1 is an exploded perspective view schematically showing an image input apparatus embodying the invention.

Hereinafter, embodiments of the present invention will be described with reference to the drawings. This invention provides a slim type image input apparatus in which a single plane photosensitive element array is divided into areas each corresponding to one microlens so that each area includes a plurality of photosensitive elements, and in addition partition walls are provided to prevent interference among the optical signals from the individual microlenses. FIG. 1 is an exploded perspective view schematically showing an image input apparatus embodying the invention.

In FIG. 1, reference numeral 1 represents a microlens array having microlenses 1a arranged in a two-dimensional array, in a square shape for example, and reference numeral 3 represents a photosensitive element array disposed below the microlens array 1 so as to face it and having photosensitive elements 3a arranged similarly in a two-dimensional array, in a square shape for example. Reference numeral 2 represents a partition wall layer disposed between microlens array 1 and photosensitive element array 3 and composed of partition walls 2a that are arranged below the boundaries of the individual microlenses 1a of the microlens array 1 so as to form a grid-like structure.

As shown in FIG. 1, one microlens 1a of the microlens array 1 corresponds to a plurality of photosensitive elements 3a of the photosensitive element array 3, and corresponds to one compartment formed in between in the partition wall layer 2. As an imaginary square prism drawn with broken lines indicates, these together form a signal processing unit U. The individual units are separated from one another by the partition walls 2a to prevent the optical signal from one microlens 1a from entering the adjacent units; that is, the optical path through each unit is restricted. As the photosensitive element array 3, it is possible to use a solid-state image-sensing device such as a CCD. This helps reduce the number of components needed and thereby simplify the construction of the image input apparatus.

Figure 2:
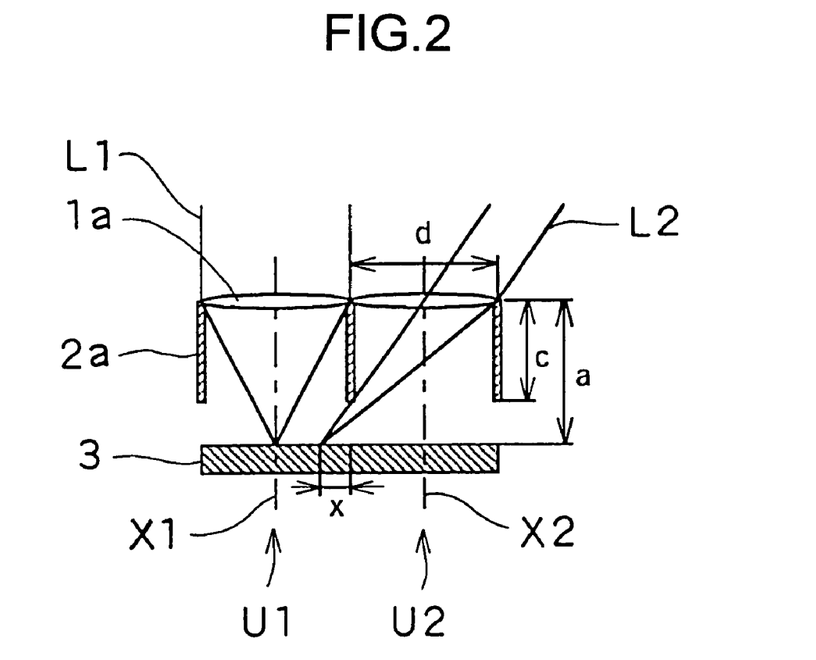
FIG. 2 is a vertical sectional view schematically showing the optical systems of two adjacent units in an image input apparatus embodying the invention.

FIG. 2 is a vertical sectional view schematically showing the optical systems of two adjacent ones among those units. In this figure, when an image of an object (not shown) located above the apparatus is focused within the target unit U1, the light beam L1 coming from the object as a rightful optical signal strikes the microlens 1a belonging to the unit U1 by traveling parallel to the optical axis X1 thereof. Then, the light beam is condensed by that microlens 1a on the photosensitive element array 3 belonging to the unit U1. At this time, if a light beam L2, as an unnecessary optical signal, enters the adjacent unit U2 by traveling obliquely from a direction opposite to the target unit U1 at a large angle relative to the optical axis X2 of the microlens 1a belonging to the unit U2, this unnecessary light beam L2 also is focused on the photosensitive element array 3 belonging to the target unit U1.

It is for the purpose of preventing such interference that the partition walls 2a, as shown in FIG. 2, are provided between the units. It is needles to say that interference is perfectly prevented if the partition walls are formed so as to extend from the microlenses 1a to the photosensitive element array 3. However, even if the partition walls are formed partially, they effectively reduce unnecessary signals. When the partition walls 2 are formed so as to extend vertically from the microlenses 1 downward, as shown in FIG. 2, for each unit, the following formula (1) holds:

$$x=(a-c)d/2c \quad (1)$$

where x represents the width of the area struck by an optical signal coming from an adjacent unit and having half the amount of light per microlens;

a represents the distance between the microlens and the photosensitive element;

c represents the height of the partition walls;

d represents the width of the unit.

In this case, it is not possible to perfectly prevent interference; however, the higher the partition walls are made, the less interference occurs. How much the interference among signals affects the image information eventually obtained can be evaluated practically by simulation or the like.

Regarding the microlens array mentioned above, the sizes of the whole microlens array and of each unit, the number of microlenses, the focal length, the manufacturing process will be presented below. Here, two types of microlens array, one using diffractive optical lenses and the other using refractive lenses, are presented. Moreover, as the type using diffractive optical lenses, two examples of different sizes are presented.

TABLE 1

| <<Diffractive Optical Lens Type>> | | |
|---|---|---|
| Unit pitch | 176 μm | 250 μm |
| Overall size | 8.8 mm × 6.7 mm | 15 mm × 15 mm |
| | (50 × 38 units) | (60 × 60 units) |
| Focal length | 176 μm | 250 μm |

Manufacturing Process

Figure 3A:
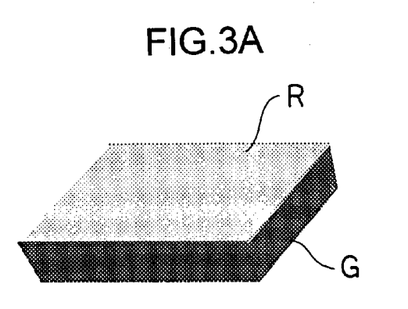
FIGS. 3A to 3D are perspective views schematically showing the manufacturing process of diffractive optical lenses.
Figure 3B:
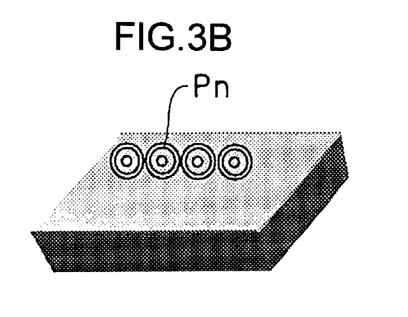
Figure 3C:
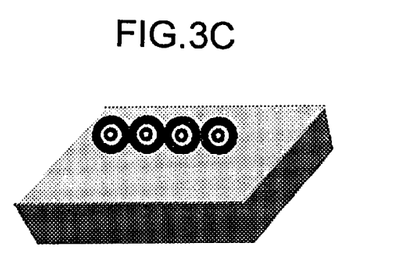
Figure 3D:
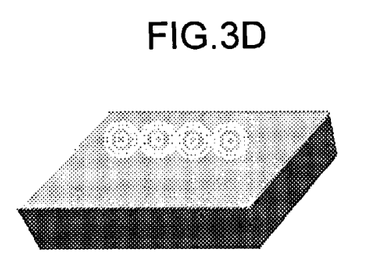

The manufacturing process of diffraction optical lenses is shown in FIGS. 3A to 3D. First, as shown in FIG. 3A, a resist R is applied to the surface of a glass substrate G. As this resist R, an electron resist is used. Next, as shown in FIG. 3B, by using an electron beam drawing machine, the desired pattern Pn is drawn on the resist R. Then, as shown in FIG. 3C, the drawn pattern is developed. Finally, as shown in FIG. 3D, the drawn and developed pattern is transferred onto the glass substrate G by using an etching machine.

The drawn pattern consists of Fresnel zone plates of either a binary or a multilevel type. Prototype lens arrays currently being manufactured have a minimum line width of 0.4 $\mu$m with binary-type zone plates and 0.2 $\mu$m with multilevel-type zone plates. When the minimum line width is as wide as about 1 $\mu$m, a laser beam can be used to draw the pattern.

TABLE 2

| <<Refractive Lens Type>> | | |
|---|---|---|
| Unit pitch | 176 $\mu$m | 250 $\mu$m |
| Overall size | 8.8 mm × 6.7 mm (50 × 38 units) | 15 mm × 15 mm (60 × 60 units) |
| Focal length | about 230 $\mu$m | about 350 $\mu$m |

Manufacturing Process

Figure 4A:
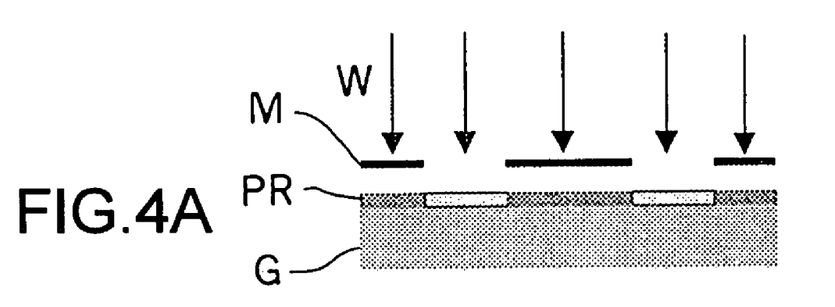
FIGS. 4A to 4D are diagrams schematically showing the manufacturing process of refractive lenses.

FIGS. 4A to 4D show the manufacturing process of refractive lenses. A so-called thermal re-flow method is applied here. First, as shown in FIG. 4A, a glass substrate G having a photo resist PR applied to its surface is coated with a mask M having a pattern drawn thereon. Then, the glass substrate G is exposed to light from above as indicated by arrows W. The pattern is thus transferred onto the photo resist PR by so-called photolithography. Here, unlike diffractive optical lenses, the pattern consists not of Fresnel zone plates but of an array of circles that is used as a mask.

Figure 4B:
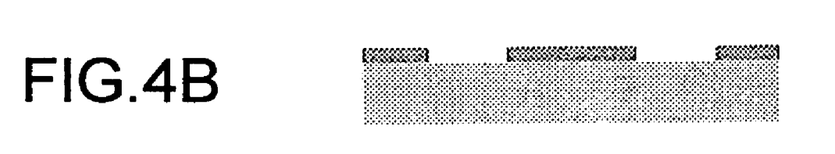
Figure 4C:
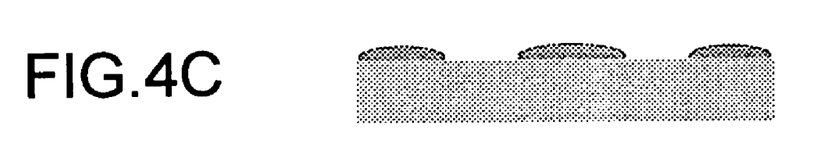
Figure 4D:
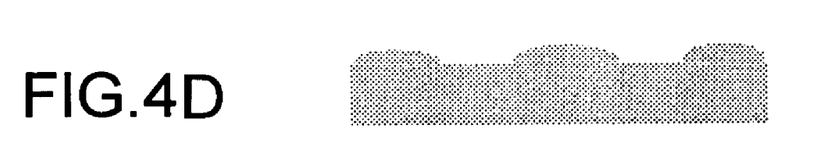

After exposure and then development, as shown in FIG. 4B, the resist remains as a pattern of cylindrical patches. As shown in FIG. 4C, when these remaining resist patches are post-baked by using a hotplate or an oven, they melt and form into the shapes of lenses by their own surface tension. As shown in FIG. 4D, by etching these resist patches, the resist patter is transferred onto the glass substrate G. Quartz is the typical material of the glass substrate G. The thermal re-flow method mentioned above is described in: "Micro-optics" by Hans Peter Herzig, p132–p136, published 1997 by Taylor & Francis.

The partition walls mentioned above need to meet the following requirements:

1. The partition walls should be as thin as possible.
2. The partition walls should preferably extend from the microlenses to the photosensitive element surface.
3. The partition walls should be opaque and should reflect or scatter as little light as possible.

In practice, the partition walls are produced, for example, by cutting a metal with a laser, or by three-dimensionally molding a photo-setting resin. As an example produced by cutting a metal with a laser, prototype partition walls having a thickness of 20 $\mu$m and arranged at intervals of 250 $\mu$m are produced from a stainless steel plate having a thickness of 200 $\mu$m. Here, to prevent reflection, the surfaces of the partition walls are blackened.

As an example produced by three-dimensionally molding a photo-setting resin, prototype partition walls are produced by scanning with a laser beam a resin called pentaerythritol triacrilate (PETA), which has a highly self-focusing property against light entering it, with 3% of benzil added thereto as a photopolymerization starter. It is confirmed that the partition walls thus produced have a thickness of about 56 $\mu$m and a height of about 500 $\mu$m.

Figure 5:
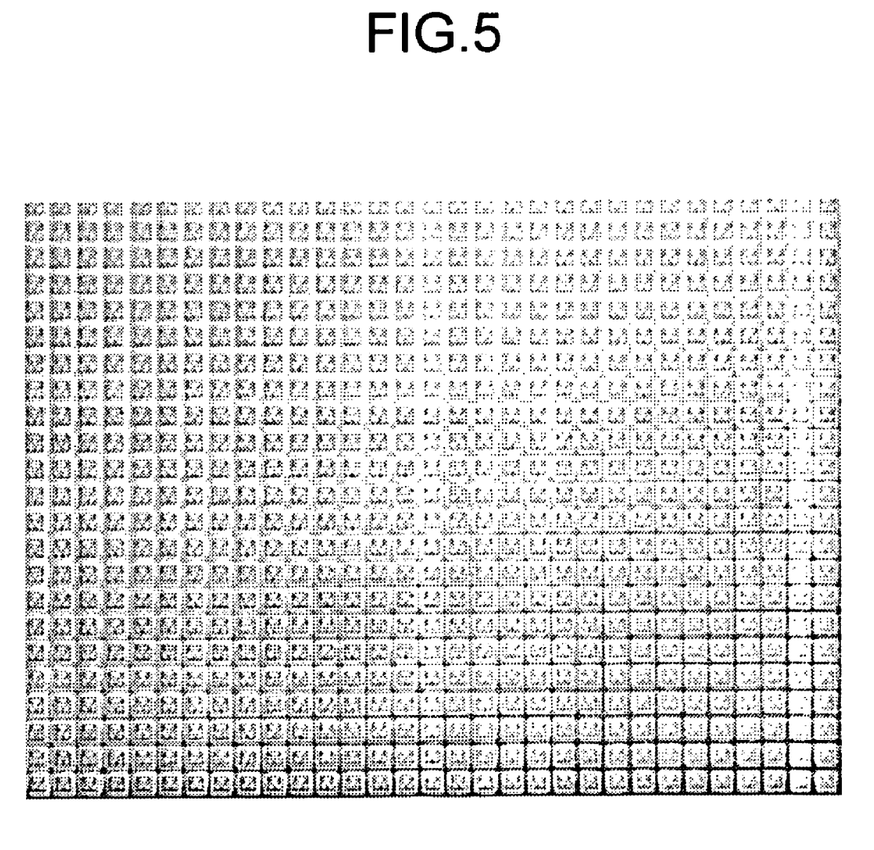
FIG. 5 is a diagram showing the multiple reduced images formed by the lens array.

How, the image obtained by using the image input apparatus of this embodiment will be described. FIG. 5 is a diagram of multiple reduced images formed by the lens array. The lens array used here is an array of gradient-index plane microlenses produced by ion exchange that have a focal length of 650 $\mu$m, have an aperture diameter of 250 $\mu$m, and are arranged at intervals of 250 $\mu$m. The photosensitive element used here is a CCD image-sensing device with 739×575 elements each having an aperture of 11 $\mu$m×11 $\mu$m. In this case, approximately 22.7×22.7 elements constitute one unit. Although the number of elements that constitute one unit is not an integer number here, this does not affect the final image.

Figure 6:
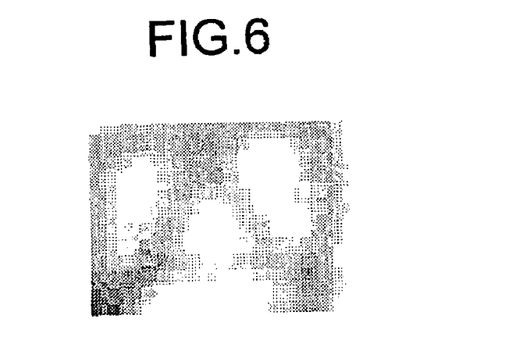
FIG. 6 is a diagram showing an image reconstructed by gathering the signals obtained from the pixels at the center of the units.
Figure 7:
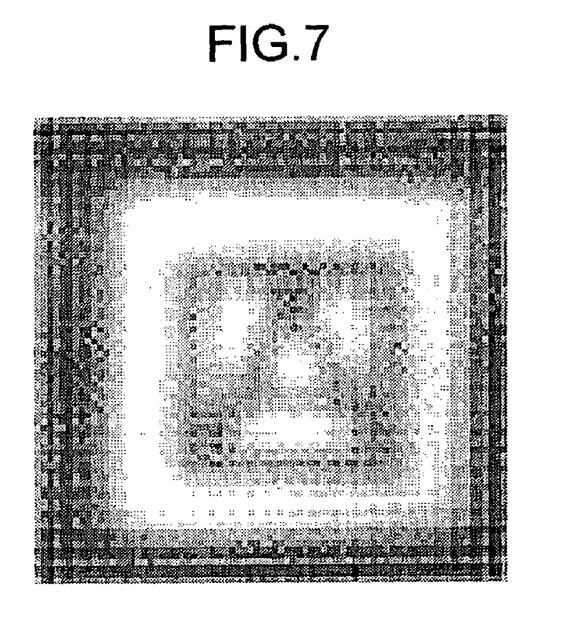
FIG. 7 is a diagram showing an image reconstructed by using the signals obtained from all the photosensitive elements.

FIG. 6 is a diagram showing an image reconstructed by gathering the signals obtained from the pixels at the centers of the units. As shown in this figure, an erect image of the object is obtained. FIG. 7 is a diagram showing an image reconstructed by using the signals obtained from all the photosensitive elements by an inverse matrix method. As shown in this figure, a satisfactory image is obtained.

Figure 8:
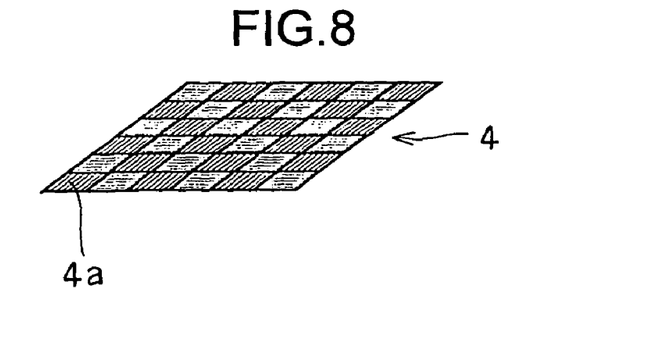
FIG. 8 is a perspective view schematically showing a signal separation polarizing filter.

Separation of adjacent signals as described above can also be achieved with a combination of polarizing filters, instead of using partition walls as described above. FIG. 8 is a perspective view schematically showing such polarizing filters. As shown in this figure, this polarizing filter array 4 is divided into blocks 4a each corresponding to one unit described above and has polarized light transmitting filters arranged in a checkered pattern such that every two adjacent filters have mutually perpendicular polarization directions. Two such polarizing filter arrays are prepared and arranged one at the microlens array surface and the other at the photosensitive element surface shown in FIG. 1 with each polarizing filter aligned with the corresponding unit.

Here, with respect to a given unit, the filter blocks 4a adjacent thereto upward, downward, leftward, and rightward transmit only light polarized perpendicularly to the polarization direction of the filter block of the given unit. Thus, interference among the optical signals entering these adjacent units is prevented. By selectively using the signals obtained through units of a particular polarization direction, it is possible to realize an image input apparatus that exhibits different sensitivities in different polarization direction.

As those polarizing filters, either diffractive optical elements or hybrid elements, i.e. diffractive optical elements and refractive optical elements combined together, are used. The polarizing filters, when composed of diffractive optical elements, is produced in the same manner as the diffractive lens array described above. That is, a resist pattern drawn by using an electric beam drawing machine is transferred onto a glass substrate by etching. Here, the pattern of the polarizing filters is basically of a binary type consisting of lines and spaces. A minimum line width of approximately 0.2 $\mu$m can be obtained by using currently available electric beam drawing machine. Like the microlens array, when a relatively large minimum line width suffices, a laser beam drawing machine can be used.

Now, how this image input apparatus is used when it is used as an image input apparatus that exhibits different sensitivities in different polarization directions will be described. In general, on the basis of polarization information of an object, it is possible to know physical properties, such as the dielectric constant, of the object. To conduct measurement with a high sensitivity, accurate alignment and the like are necessary. However, even with a comparatively simple image input apparatus, it is possible to obtain general information regarding physical properties of an object. For example, when reflection occurs on the surface of a dielectric substance, it exhibits varying reflectances toward differently polarized light components. Thus, by observing polarization information, it is possible to know the angle of the reflecting surface relative to the image input apparatus.

For example, this technique can be applied in a measuring instrument for measuring the angle of a reflecting surface such as a glass plate. As other examples, this technique can be applied to measurement of stress distribution inside a transparent object such as a plastic plane, or in an image input apparatus, such as a polarizing filter used in a camera, which acquires an object image by separating images reflected from and transmitted through a glass plate.

The total thickness of an image input apparatus embodying the present invention depends on the following parameters:

(Thickness of the Glass Substrate)+(Focal Length of the Microlenses)+(Thickness of the Photosensitive Elements)

Figure 9A:
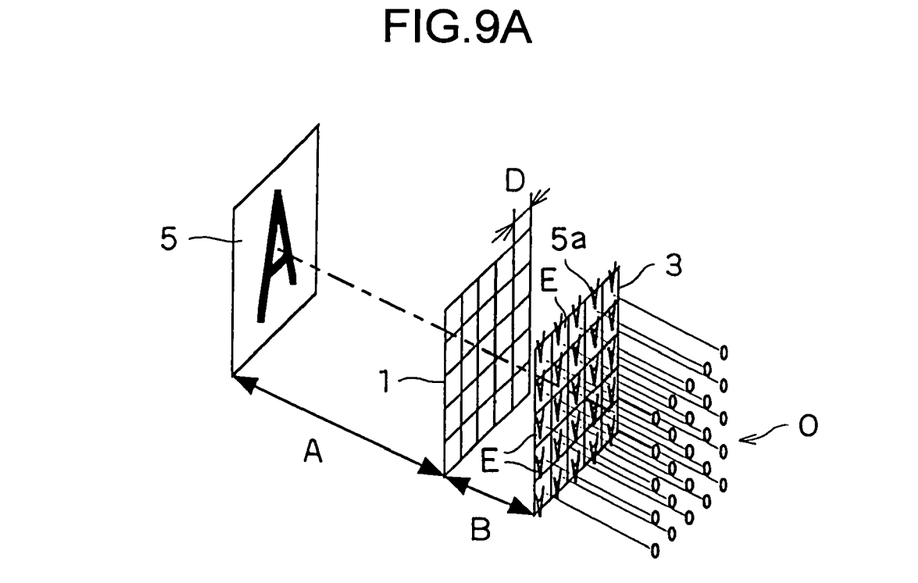
FIGS. 9A and 9B are perspective views schematically showing the configuration of the signal processing system for processing optical signals.
Figure 9B:
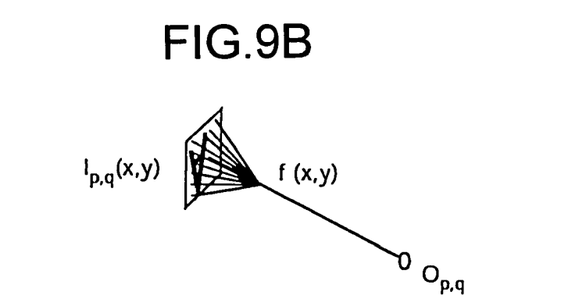

FIGS. 9A and 9B are perspective views schematically showing the configuration of the signal processing system for processing the optical signals acquired by an image input apparatus of the invention. As shown in FIG. 9A, assume that the distance between the object 5 and the microlens array 1 is A, the distance between the microlens array 1 and the photosensitive element array 3 is B, and the intervals at which the individual units are arranged is D. Reference symbol O represents the output signals obtained from the photosensitive element array 3. Moreover, suppose that the numbers of the column and row in which a unit of the image input apparatus lies are represented by p and q, and that, as shown in FIG. 9B, the minute image in the unit [p, q] (i.e. the input signal entering the unit) is expressed as $I_{p,q}(x, y)$ and the choice function of the input signals is expressed as $f_{p,q}(x, y)$, then the output signal $O_{p,q}$ is given by formula (2) below.

$$O_{pq} = \int\int I_{p,q}(x,y) f_{p,q}(x,y) dx dy \quad (2)$$

In FIG. 9A, in individual regions E on the photosensitive element array 3 (photoelectric converter element), images of the area (object 5) are formed as object images 5a seen from different view points. The images obtained in the individual units are object images 5a shifted by a predetermined distance from one another on the photosensitive element array 3 in accordance with the arrangement of the object 5, the microlens array 1, and the photosensitive element array 3. For simplicity's sake, assume that the microlens array 1 exerts no deflecting effect. Then the relative shift amount $\Delta$ in each unit is given by formula (3) below.

$$\Delta = BD/A \quad (3)$$

Accordingly, using the input signal $I_{0,0}(x, y)$ of the unit [0, 0], the output signal of each unit is given by formula (4) below.

$$O_{p,q} = \int\int I_{0,0}(x-p\Delta, y-q\Delta) f_{p,q}(x,y) dx dy \quad (4)$$

Here, by manipulating the choice function $f_{p,q}(x, y)$ of each unit, it is possible to obtain various effects. For example, when only the signal at the unit origin is chosen, then $f_{p,q}(x, y) = \delta(x, y)$, and hence the output signal is given by formula (5) below.

$$O_{p,q} = I_{0,0}(-p\Delta, -q\Delta) \quad (5)$$

This formula presents the image obtained by enlarging $I_{0,0}(x, y)$ by a factor of A/BD. Since $I_{0,0}(x, y)$ represents an inverted image of the object enlarged by a factor of A/B, the aggregate of the output signals from the individual units $O_{p,q}$ is equivalent to an erect image of the object enlarged by a factor of 1/D.

Now, as another case, assume that formula (6) below is used as the unit choice function.

$$f_{p,q}(x,y) = \delta(x - \alpha p, y - \beta q) \quad (6)$$

In this case, formula (2) above yields formula (7) below.

$$O_{p,q} = I_{0,0}\{-p(\Delta - \alpha), -q(\Delta - \beta)\} \quad (7)$$

This formula indicates that an image of the object enlarged by a factor of $\Delta/(\Delta-\alpha)D$ in the x direction and by a factor of $\Delta(\Delta-\beta)D$ in the y direction is obtained.

Now, as still another case, assume that formula (8) below is used as the unit choice function.

$$f_{p,q}(x,y) = \delta\{x - (P-p)\Delta(\cos\theta - 1) - (Q-q)\Delta\sin\theta, y + (P-p)\Delta\sin\theta - (Q-q)\Delta(\cos\theta - 1)\} \quad (8)$$

In this case, the output signal is given by formula (9) below.

$$O_{p,q} = I_{P,Q}\{(P-p)\Delta\cos\theta + (Q-q)\Delta\sin\theta, -(P-p)\Delta\sin\theta + (Q-q)\Delta(\cos\theta)\} \quad (9)$$

This formula represents an image equivalent to an image of the object rotated through $\theta$ degrees counter-clockwise about the unit [P, Q].

Now, as a further case, assume that formula (10) below is used as the unit choice function.

$$f_{p,q}(x,y) = \delta(x) rect(y/1_y) \quad (10)$$

In this case, when input signals spreading in the y direction are chosen, the output signal is given by formula (11) below.

$$O_{p,q} = \int_{-1y/2}^{1y/2} I_{0,0}(-p\Delta, y - q\Delta) dy \quad (11)$$

This response characteristic can be used to extract the information of a line segment extending in the y direction.

As described above, by varying the definition of the unit choice function $f_{p,q}(x, y)$, the obtained image signals can be processed in various ways. In an image input apparatus of the present invention, this can be achieved by specifying the addresses of the signals read out from the photosensitive element array. In other words, by calculating, using the signals from the photosensitive elements at the addresses corresponding to the choice function used, the output signals of the units they belong to, it is possible to obtain output signals corresponding to formula (2).

Note that, in an image input apparatus of the present invention, even if the constituent components are aligned insufficiently with one another in assembly, it is possible to obtain correct signals by processing the signals in an appropriate manner. Specifically, the procedure for achieving this is as follows. First, the partition walls are aligned with and then bonded to the microlens array, then the thus obtained integral unit is arranged in close contact with the surface of the photosensitive element array. In this state, the apparatus is already ready for use, but, to achieve more efficient use of the photosensitive element array and to facilitate post-processing, the above-mentioned integral unit is aligned with the photosensitive element array such that the partitions of the former are parallel with the regions of the latter.

This is achieved by observing the moire fringes that are formed by the shadow of the partition walls and the photosensitive regions when light is shone into the apparatus. In this adjustment procedure, the pixels that output bright-state signals are regarded as effective pixels from which to read actual optical signals, and therefore, by using the positions of these pixels, it is possible to know the correspondence between the signals of the individual units and the addresses at which to read the outputs of the photosensitive elements. For example, unnecessary signals can be easily excluded by masking the other signals than those of the effective pixels after acquiring the data from all pixels.

Incidentally, $I_{p,q}$ corresponds to the signal obtained from the photosensitive elements of the unit [p, q]. Thus, when the partition walls reach the photosensitive element surface, $I_{p,q}$ represents the signals from the photosensitive elements except those located at the partition walls. When the partition walls do not reach the photosensitive element surface, $I_{p,q}$ represents the signals from the photosensitive elements excluding the photosensitive regions where interference is occurring.

Figure 10:
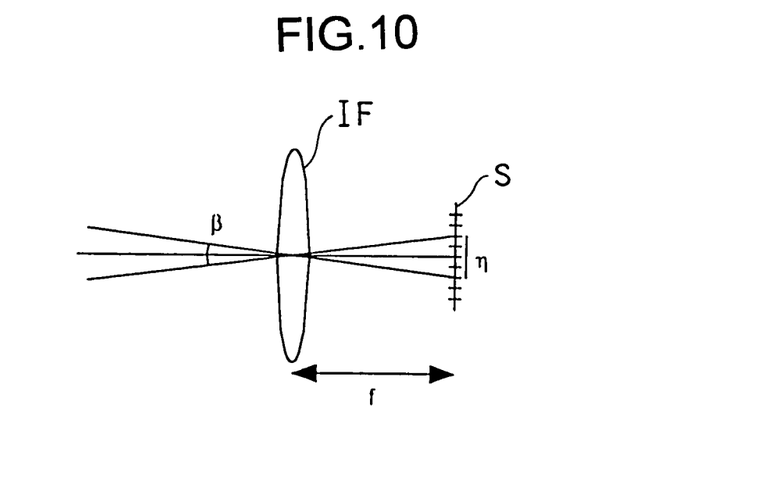
FIG. 10 is a diagram schematically illustrating the relationship between the photosensitive area and the minute view angle.

In an actual image input apparatus, $f_{p,q}$ has finite sampling range and thus is a "rect" function, i.e. a function that gives "1" within the range corresponding to the regions (minute view angles) participating in image sensing and that gives "0" outside that range. In FIG. 10, the relationship between the width η of a pixel that senses light on the photosensitive element surface S and minute view angle β is given by formula (c) below.

$$\beta = 2\tan^{-1}(\eta/2f) \tag{c}$$

where f represents the focal length of an image formation element IF. The range of the rect function is determined by using this formula.

Figure 11:
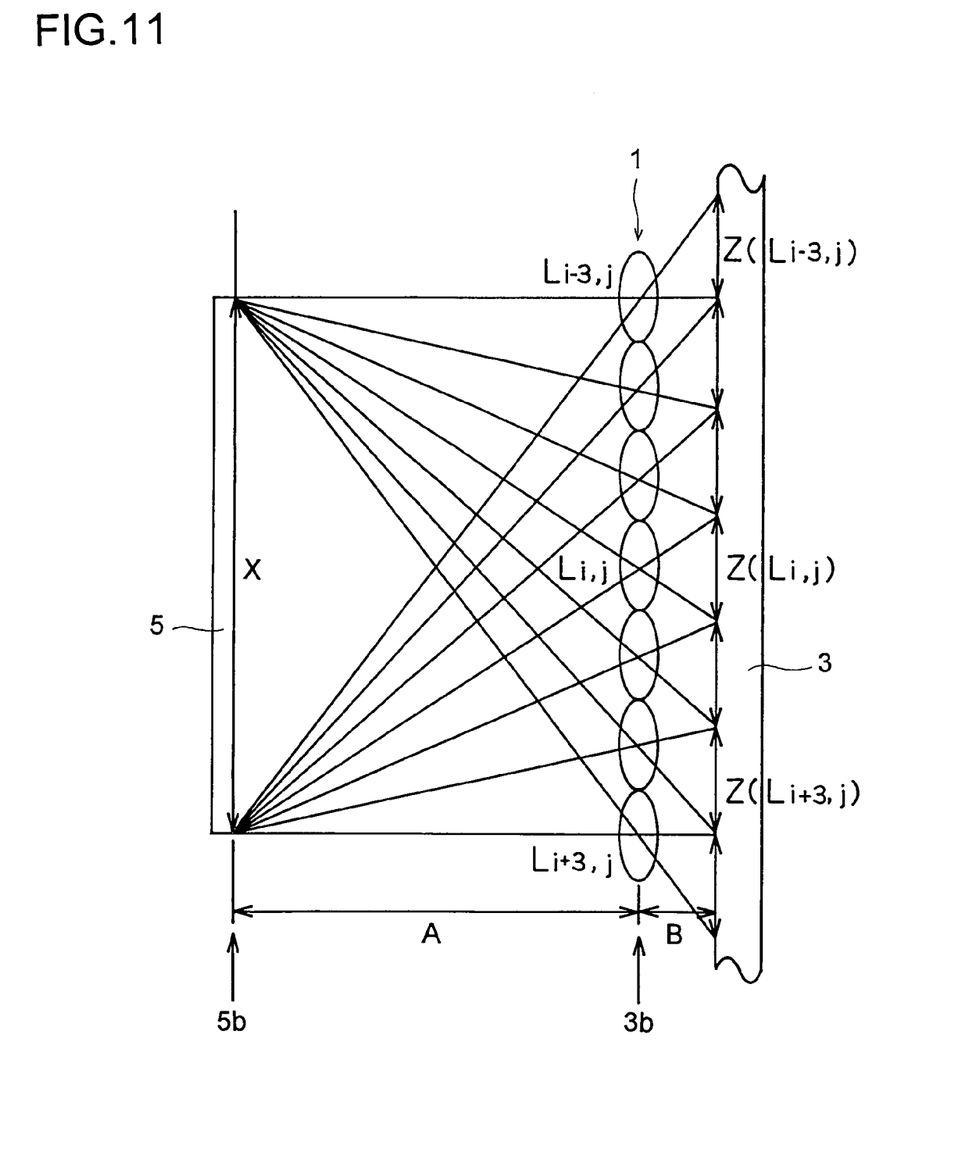
FIG. 11 is a diagram schematically showing the relationship between the object and the view angle of the image input apparatus.

FIG. 11 is a diagram schematically showing the relationship between the object and the field of view of the image input apparatus. This figure shows a case in which an image of an object 5 occupying an area extending over a length of X is formed on the photosensitive element array 3 through the microlenses $L_{i,j}$. Inverted, reduced images of the entire object 5 are formed through the individual microlenses of the microlens array 1 on the corresponding regions of the photosensitive element array 3. Here, since the individual lenses of the microlens array 1 have different positional relationships with the object 5, the images formed on the individual regions of the photosensitive element array 3 have different information from one another. This is exploited to reconstruct an image.

Specifically, an image X of the entire object 5 is focused through each microlens $L_{i,j}$ of the microlens array 1, so as to form an image Z ($L_{i,j}$) on the corresponding region of the photosensitive element array 3. In other words, the same number of inverted, reversed images of the object surface 5b on the object 5 as that of microlenses in the microlens array 1 are formed on the image formation surface 3b of photosensitive element array 3. Here, since the individual regions of the photosensitive element array corresponding one to one to the individual lenses have different positional relationships with the object 5, the images formed on the individual regions have different information as to the position of the image within the region, the intensity of the signal, and the like. This is exploited, for details, refer to the descriptions of FIG. 9A and FIG. 9B above.

Figure 12A:
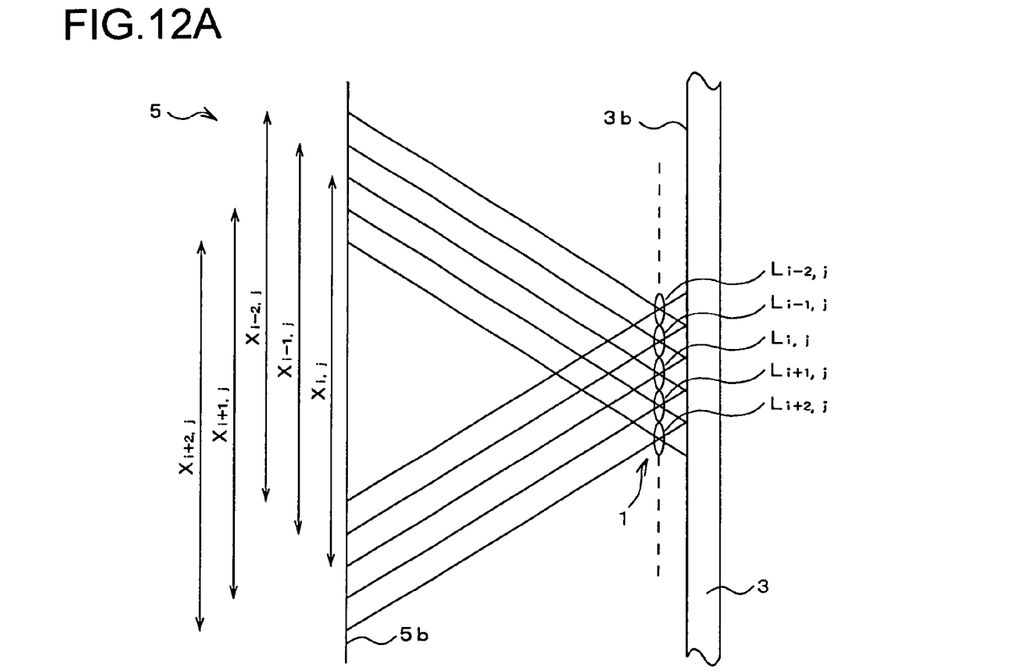
FIGS. 12A and 12B are diagrams schematically showing the principle of making the view angle of the image input apparatus wider.
Figure 12B:
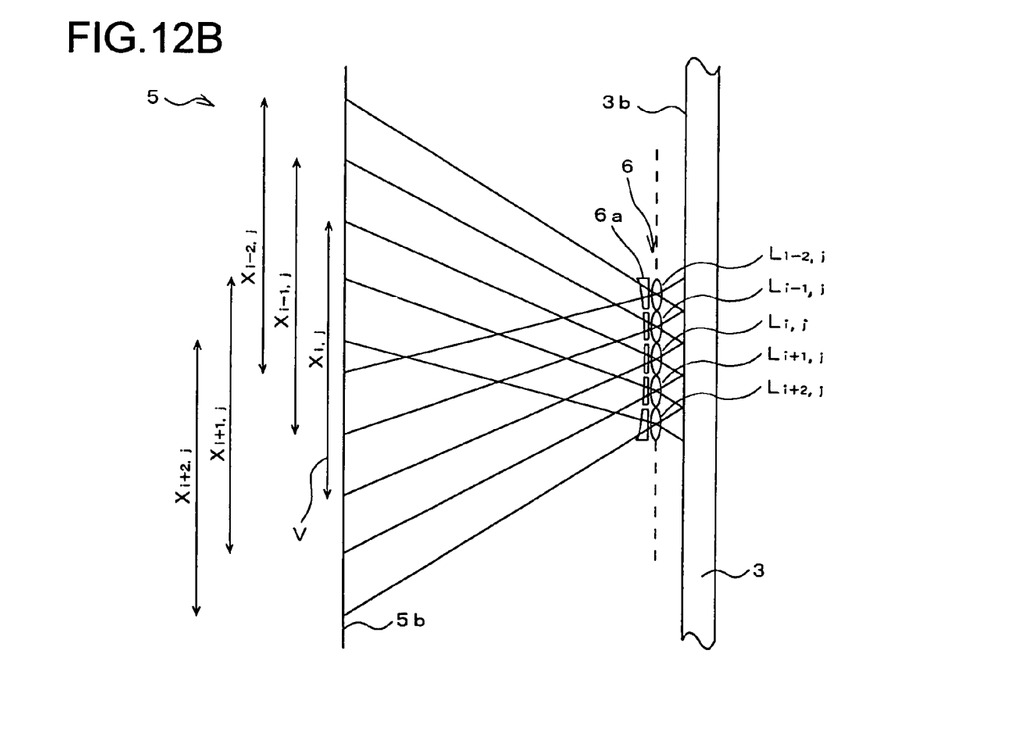

FIGS. 12A and 12B are diagrams schematically showing the principle of making the field of view of the image input apparatus wider. As shown in FIG. 12A, each microlens $L_{i,j}$ of the microlens array 1 images a length of $X_{i,j}$ on the object plane 5b on the object 5 onto the image formation surface 3b of the photosensitive element array 3. Since the individual microlenses $L_{i,j}$ are located at different locations, they form images of different areas on the object surface 5b. As shown in FIG. 12B, such differences are increased by the use of deflecting member, which thus helps make the overall field of view wider.

Thus, when shooting needs to be performed with a wider view angle instead of the microlens array 1, for example, a lens array 6 with a deflection function, i.e. a functional optical element having both deflecting and image-forming functions is used. This lens array 6 has deflecting elements 6a provided one for each unit. Thus, the fields of view V of the individual units combine to cover a wider area on the object 5.

Deflecting elements having such a deflecting function can be realized not only with prisms but also with diffracting optical elements. Their material, manufacturing process, size, and others are common to the diffractive lenses described earlier. Specifically, one method is to decenter the center of a pattern, such as Fresnel zone plate, that has an image-formation function in the direction in which to diffract the incident light. Another method is to overlay a one-dimensioned diffraction grating on an image-forming diffractive optical element. Both methods produce the same effects. When the deflection angle is relatively narrow, the former method is recommendable and when the deflection angle is relatively wide, the latter method is recommendable. How the field of view varies as a result of introduction of deflecting elements can be controlled by manipulating the parameters of each deflecting element.

Figure 13:
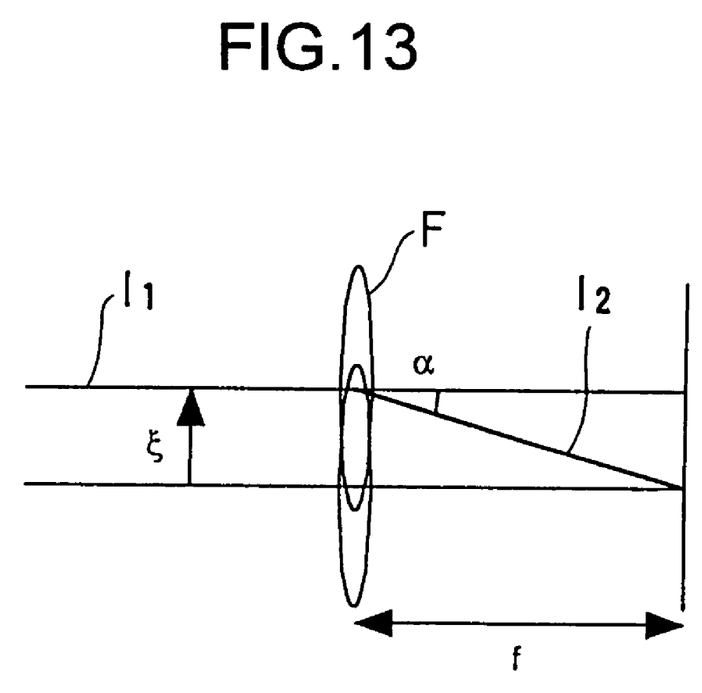
FIG. 13 is a diagram schematically illustrating deflection caused by decentering of the image formation elements.
Figure 14:
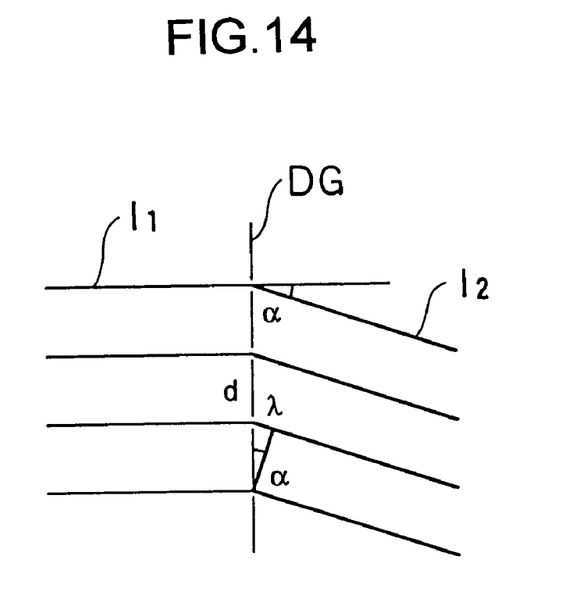
FIG. 14 is a diagram schematically illustrating deflection caused by a diffraction grating.

FIG. 13 is a diagram schematically illustrating an example of the construction based on the former method described above. In this diagram, ξ represents the amount of decentering of the Fresnel zone plate F, α represents the view angle, and f represents the focal length. FIG. 14 is a diagram schematically illustrating an example of the construction based on the latter method described above. In this diagram, d represents the grating constant of the one-dimensioned diffraction grating DG, α represents the view angle, and λ represents the wave length of the incident light. In both diagrams, $l_1$ represents the incident light and $l_2$ represents the diffracted light. Here, the decentering amount ξ and the grating constant d function as the above-mentioned parameters of each deflecting elements. The view angle α that each unit offers is equal to the deflection angle through which the incident light is deflected. Thus, FIGS. 13 and 14 give formulae (a) and (b) below.

$$\alpha = \tan^{-1}(\xi/f) \tag{a}$$

$$\alpha = \sin^{-1}(m\lambda/d) \tag{b}$$

where m represents an integer number. When a diffraction grating is used, a large number, corresponding to m, of kinds of diffracted light appear. However, for example by giving the diffraction grating blaze-shaped grooves, it is possible to obtain only one kind of diffracted light.

Figure 15:
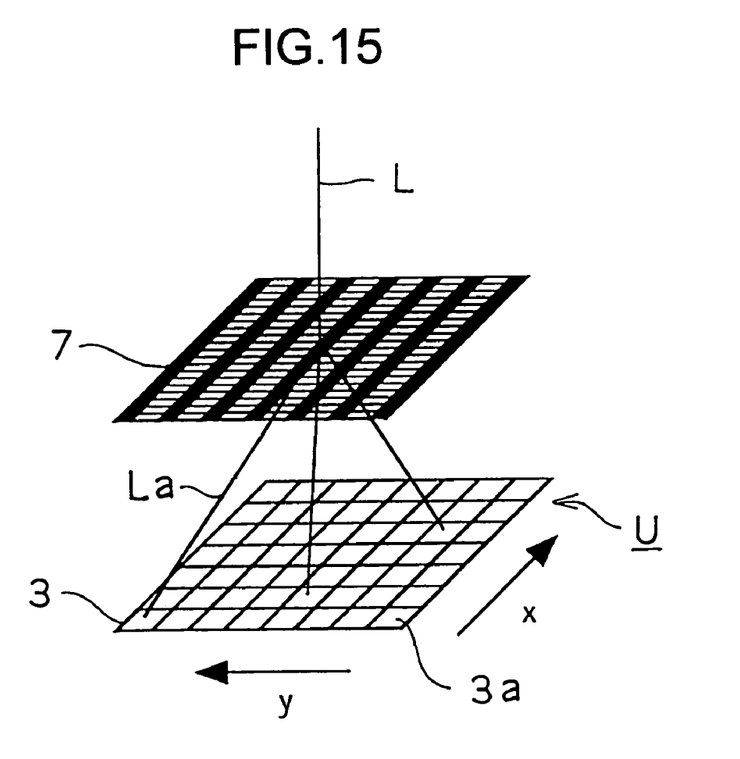
FIG. 15 is a perspective view schematically showing the construction of an image input apparatus employing dispersive elements.

FIG. 15 is a perspective view schematically showing the construction of an image input apparatus employing a functional optical element to which a dispersive property is added. As shown in this diagram, which shows only a portion corresponding to one unit, as a functional optical element, a diffraction grating 7 is arranged above a photosensitive element array 3 so as to face it. Independent spectroscopes are formed one for each unit, so that the spectral data of different parts of the sensed object can be obtained. This diffraction grating 7, having different grating constants in the x and y directions indicated by arrows in the diagram, deflects the incoming light L at different angles according to the wave length, and then leads the resulting optical signal as spectral light La to the photosensitive elements 3a located at different locations on of the photosensitive element array 3.

Here, it is not necessary to provide a special filter for selecting particular wave lengths on the side of the photosensitive element array 3, and therefor a so-called single plane photosensitive element can be used as it is. The photosensitive elements 3a constituting each unit are arranged in a square shape, and by deflecting the optical signals of the spectral light La in such a way as to cover all the area of that square, it is possible to make efficient use of the photosensitive elements 3a.

The spectroscopes mentioned above are manufactured as diffractive optical elements just like the polarizing filters and deflecting elements described earlier. Therefore, they are produced from a quartz glass substrate by a similar manufacturing process. The pattern formed here is designed to have different predetermined grating constants in the x and y directions so that incident light is deflected at varying angles according to the wave length independently in each direction.

Images obtained as a set of spectral data in this way have the following advantages and uses. Generally, an object is observed through a primary color filter when it is handed as visual information; however, more versatile information of the object can be obtained by using its spectral data. For example, different materials have different spectral absorption coefficients, and therefore it is possible to identify the materials constituting the object and investigate their distribution by measuring the spectrum absorbed by the object. Furthermore, this technique can be applied to an apparatus which checks the level of comfortableness, mental state, and the like of a subject person by measuring the person's perspiration by using the wave length information of the light absorbed by water. For details, refer to Japanese Laid-Open Patent Application No. H8-184555.

What is claimed is:

1. An image input apparatus comprising:
   an image formation unit array having a plurality of image formation units arranged in an array;
   a photoelectric converter element having a flat photosensitive surface, the photosensitive surface being divided into regions, each corresponding to one of the image formation units, where each region includes a plurality of photosensitive elements arranged therein; and
   a restricting member for restricting, independently for each of the plurality of image formation units, optical paths along which the light beams are focused,
   wherein the plurality of image formation units individually receive light beams substantially from an identical area and focus the received light beams on different regions of the photosensitive surface of the photoelectric converter element to form two-dimensional images of a subject in corresponding regions of the photosensitive surface such that each two-dimensional image is an image of substantially the same area of an object in the identical area as seen from a different view point, and
   wherein the restricting member is a polarizing filter array having polarizing filters arranged one for each group of the plurality of image formation units, every two adjacent polarizing filters having mutually perpendicular polarization angles.

2. An image input apparatus comprising:
   an image formation unit array having a plurality of image formation units arranged in an array;
   a photoelectric converter element having a flat photosensitive surface, the photosensitive surface being divided into regions, each corresponding to one of the image formation units, where each region includes a plurality of photosensitive elements arranged therein;
   a restricting member for restricting, independently for each of the plurality of image formation units, optical paths along which the light beams are focused, wherein the plurality of image formation units individually receive light beams substantially from an identical area and focus the received light beams on different regions of the photosensitive surface of the photoelectric converter element to form two-dimensional images of a subject in corresponding regions of the photosensitive surface such that each two-dimensional image is an image of substantially the same area of an object in the identical area as seen from a different view point; and
   spectroscopic members provided one for each of the plurality of image formation units.

3. An image input apparatus as claimed in claim 2, wherein the spectroscopic members are diffraction gratings.

4. An image input apparatus as claimed in claim 3, wherein the diffraction gratings have different grating constants in two mutually perpendicular directions.

* * * * *